United States Patent
Vico Trivino et al.

(10) Patent No.: US 10,958,040 B1
(45) Date of Patent: Mar. 23, 2021

(54) FABRICATION OF ELLIPSOIDAL OR SEMI-ELLIPSOIDAL SEMICONDUCTOR STRUCTURES

(71) Applicant: International Business Machines Corporation, Armonk, NY (US)

(72) Inventors: Noelia Vico Trivino, Zurich (CH); Svenja Mauthe, Zurich (CH); Philipp Staudinger, Zurich (CH); Kirsten Emilie Moselund, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/573,309

(22) Filed: Sep. 17, 2019

(51) Int. Cl.
| | |
|---|---|
| *H01S 5/00* | (2006.01) |
| *H01S 5/10* | (2021.01) |
| *H01S 5/40* | (2006.01) |
| *H01S 5/34* | (2006.01) |
| *H01S 5/343* | (2006.01) |
| *H01S 5/347* | (2006.01) |

(52) U.S. Cl.
CPC .......... *H01S 5/1075* (2013.01); *H01S 5/4025* (2013.01); *H01S 5/34* (2013.01); *H01S 5/343* (2013.01); *H01S 5/347* (2013.01); *H01S 2304/04* (2013.01)

(58) Field of Classification Search
CPC ........ H01S 5/1075; H01S 5/34; H01S 5/4025; H01S 5/343; H01S 5/347; H01S 2304/04
See application file for complete search history.

(56) References Cited

U.S. PATENT DOCUMENTS

| | | | | |
|---|---|---|---|---|
| 4,247,498 A | * | 1/1981 | Castro | .................... A01N 25/10 264/28 |
| 6,342,695 B1 | * | 1/2002 | Ramer | .................. G01D 5/264 250/214 R |
| 6,741,628 B2 | | 5/2004 | Painter et al. | |
| 6,795,481 B2 | * | 9/2004 | Maleki | ............... G02B 6/29341 372/108 |
| 7,811,846 B2 | * | 10/2010 | Wang | .................. B81C 1/00047 438/42 |

(Continued)

OTHER PUBLICATIONS

Vollmer et al., "Whispering-gallery-mode biosensing: label-free detection down to single molecules," Nature Methods, vol. 5, No. 7, Jul. 2008, pp. 591-596.

(Continued)

*Primary Examiner* — Kinam Park
(74) *Attorney, Agent, or Firm* — Kelsey M. Skodje

(57) ABSTRACT

A method for fabricating an ellipsoidal or semi-ellipsoidal semiconductor structure includes steps of providing a semiconductor substrate and fabricating an ellipsoidal or semi-ellipsoidal cavity structure on the semiconductor substrate. The cavity structure encompasses a seed surface of the semiconductor substrate. The method includes a further step of growing the ellipsoidal or semi-ellipsoidal semiconductor structure within the ellipsoidal or semi-ellipsoidal cavity structure from the seed surface of the semiconductor substrate. Fabricating the cavity structure includes arranging a droplet comprising a sacrificial material on the semiconductor substrate, forming a layer of a coating material on the semiconductor substrate and the droplet, and selectively removing the sacrificial material of the droplet to expose the cavity structure.

20 Claims, 9 Drawing Sheets

(56) References Cited

U.S. PATENT DOCUMENTS

| | | | |
|---|---|---|---|
| 8,792,528 | B2 | 7/2014 | Blick et al. |
| 2002/0080842 | A1* | 6/2002 | An .................... B82Y 10/00 372/92 |
| 2002/0097401 | A1* | 7/2002 | Maleki ............... G01N 21/7746 356/436 |
| 2004/0179573 | A1* | 9/2004 | Armani ............. G02B 6/12007 372/94 |
| 2006/0114960 | A1* | 6/2006 | Snee ..................... H01S 3/0627 372/67 |
| 2010/0187572 | A1* | 7/2010 | Cho .................. H01L 21/02521 257/200 |
| 2011/0032964 | A1 | 2/2011 | Sauer et al. |
| 2012/0070886 | A1* | 3/2012 | DeLouise ......... B01L 3/502707 435/288.7 |
| 2012/0286452 | A1* | 11/2012 | DeLouise ......... B01L 3/502707 264/334 |
| 2017/0025813 | A1* | 1/2017 | Eden ........................ H01S 3/30 |

OTHER PUBLICATIONS

Righini, G., "Glassy Microspheres for Energy Applications," Micromachines, 9, 379, pp. 1-18, 2018. DOI: 10.3390/mi9080379.

Yoshiki et al., "All-optical tunable buffering with coupled ultra-high Q whispering gallery mode microcavities," Scientific Reports, 7, Article No. 10688, pp. 1-8, 2017. DOI: 10.1038/s41598-017-10035-4.

O'Shea et al., "All-optical switching and strong coupling using tunable whispering-gallery-mode microresonators," Appl. Phys. B, 105(1), May 2011, Retrieved: arXiv: 1105.0330v2, pp. 1-20.

Yakunin et al., "Low-threshold amplified spontaneous emission and lasing from colloidal nanocrystals of caesium lead halide perovskites," Nature Communications 6, Article No. 8056, 2015, 9 pages.

Spillane et al., "Ultralow-threshold Raman laser using a spherical dielectric microcavity," Nature, 415, 621-623, 2002, (Abstract Only).

Okazaki et al., "Ultraviolet whispering-gallery-mode lasing in ZnO micro/nano sphere crystal," Applied Physics Letters, 101, 211105, 2012, pp. 1-5.

Kang et al., "Plasmon-Coupled Whispering Gallery Modes on Nanodisk Arrays for Signal Enhancements," Scientific Reports, 7, Article No. 11737, 2017, pp. 1-8.

Le Thomas et al. "Effect of a dielectric substrate on whispering-gallery-mode sensors," Journal of the Optical Society of America B, vol. 23, No. 11, Nov. 2006, pp. 2361-2365.

Hall et al., "Method for predicting whispering gallery mode spectra of spherical microresonators," Optics Express, 23 (8), Oct. 2014, 15 pages.

Pollinger et al., "All-optical signal processing at ultra-low powers in bottle microresonators using the Kerr effect," Optics Express, vol. 18, Issue 17, pp. 17764-17775, 2010.

Farnesi et al., Multicolour emission in silica whispering gallery mode microspherical resonators, Proceedings of SPIE, SPIE LASE, 2014, 9 pages.

Farnesi et al., "Optical Frequency Conversion in Silica-Whispering-Gallery-Mode Microspherical Resonators," Physical Review Letters, 112, 093901, 2014, pp. 1-5.

Lee et al., "A quasi-droplet optofluidic ring resonator laser using a micro-bubble," Applied Physics Letters, 99, 091102, 2011, 4 pages, DOI: 101063/1.3629814.

Chiasera et al., "Spherical whispering-gallery-mode microresonators," Laser & Photonics Reviews, Apr. 23, 2010, (Abstract Only).

Righini, G., "Glass Micro- and Nanospheres: Physics and Applications," Spring 2018, 1 pg, leaflet.

Agio, M., "Optical antennas as nanoscale resonators," Nanoscale 4, 692-706, 2012, Retrieved: arXiv:1111.1302v1, physics.optics, Nov. 5, 2011, 17 pages.

Yin et al., "Self-assembled hollow nanosphere arrays used as low Q whispering gallery mode resonators on thin film solar cells for light trapping," Phys. Chem. Chem. Phys., PCCP, 2013, 15, 16874-16882, RSC Publishing.

Hrabar et al., "Spherical Resonators acting as RF Replicas of Plasmonic Nanospheres," 2007 IEEE Antennas and Propagation Society International Symposium, 2007, pp. 4340-4343.

Li et al., "High-Q whispering-gallery mode lasing from nanosphere-patterned GaN nanoring arrays," Applied Physics Letters 98, 071106, 2011, pp. 1-3.

Ruan et al., "Atom-Photon Coupling from Nitrogen-vacancy Centres Embedded in Tellurite Microspheres," Scientific Reports 5, Article No. 11486, 2015, pp. 1-7.

Schietinger et al., "One-by-one coupling of single photon emitters to high-Q modes of optical microresonators," Proceedings Bolumen7211, Physics and Simulation of Optoelectronic Devices XVII, 72110K,Feb. 2009, 10 pgs.

Ristic et al., "About the role of phase matching between a coated microsphere and a tapered fiber: experimental study," Optics Express, vol. 21, Issue 18, pp. 20954-20963, 2013.

Manjavacas et al., "Tunable plasmons in atomically thin gold nanodisks," nature Communications, 5, Article 3548, Mar. 27, 2014, pp. 1-7.

Thomas et al., "Cavity QED with Semiconductor Nanocrystals," Nano Letters, vol. 6, No. 3, pp. 557-561, 2006.

Sutherland et al., "Conformal Organohalide Perovskites Enable Lasing on Spherical Resonators," ASC Nano, vol. 8, No. 10, pp. 10947-10952, 2014.

Chan et al., "Blue semiconductor nanocrystal laser," Applied Physics Letters, vol. 86, Issue 7, 073102, 2005, 4 pgs.

Snee et al., "Whispering-Gallery-Mode Lasing from a Semiconductor Nanocrystal/Microsphere Resonator Composite," Advanced Materials, vol. 17, Issue 9, May 2005, pp. 1131-1136, Abstract Only.

Zakowicz, W., "Whispering-Gallery-Mode Resonances: A New Way to Accelerate Charged Particles," Physical Review Letters, 95, 114801, Sep. 2005, pp. 1-4.

Moldover et al., "Gas-filled spherical resonators: Theory and experiment," Journal of the Acoustical Society of America, vol. 79, Issue 2, Feb. 1986, pp. 253-272.

Xu et al., "Wireless whispering-gallery-mode sensor for thermal sensing and aerial mapping," Light: Science and Applications, 7, Article No. 62, 2018, pp. 1-6.

Brevini et al. "Photonic Materials for Sensing, Biosensing and Display Devices", Springer, 2015, (Eds: Serpe et al.).

Astratov, V., "Fundamentals and Applications of Microsphere Resonator Circuits," 11th International Conference on Transparent Optical Neworks, ITCON 2009, pp. 1-4.

Yamamoto, Y., "Spherical resonators from π-conjugated polymers," Polymer Journal, 48, Sep. 2016, pp. 1045-1050, Abstract Only.

Zhang et al., "In-fiber whispering-gallery mode microsphere resonator-based integrated device," Optical Letters, vol. 43, No. 16, Aug. 2018, 3961, 4 pgs.

Spillane et al., "Ideality in a Fiber-Taper-Coupled Microresonator System for Application to Cavity Quantum Electrodynamics," Physical Review Letters, vol. 91, No. 4, Jul. 2003, Article 043902, pp. 1-4.

Cai et al., "Fiber-coupled microsphere laser," Optics Letters, vol. 25, Issue 19, Oct. 2000, pp. 1430-1432.

Zywietz et al. Laser printing of silicon nanoparticles with resonant optical electric and magnetic responses, nature Communications, 5, Article No. 3402, 2014, pp. 1-7.

"Laser Process Allows Precision Design of Nanospheres," Photonics Media, printed Sep. 12, 2019, 3 pgs. https://www.photonics.com/Articles/Laser_Process_Allows_Precision_Design_of/a56094.

Righini, G., "Light-matter interactions in whispering-gallery-mode microresonators," 4th International Conference on Photonics, Optics and Laser Technology (PHOTOPTICS 2016), Feb. 2016, 69 pgs.

\* cited by examiner

> US 10,958,040 B1

FABRICATION OF ELLIPSOIDAL OR SEMI-ELLIPSOIDAL SEMICONDUCTOR STRUCTURES

BACKGROUND

The present disclosure relates generally to fabricating ellipsoidal or semi-ellipsoidal semiconductor structures and, more specifically, spherical semiconductor structures for optical applications.

Optical devices (e.g., laser devices) are often formed on semiconductor III-V substrates due to these semiconductor groups' direct and tunable bandgap, which allows for radiative recombination and hence light emission. A laser is mainly composed of a resonator, also referred to as an optical cavity, providing optical feedback and an active medium providing optical gain.

SUMMARY

Various embodiments are directed to a method for fabricating an ellipsoidal or semi-ellipsoidal semiconductor structure, which can be a semiconducting material such as InP, InGaAs, AlGaAs, GaAs, GaN, InGaN, AlGaN, any ternary or quaternary alloys thereof, group II-VI semiconductors, or group IV semiconductors. The method comprises steps of providing a semiconductor substrate and fabricating an ellipsoidal or semi-ellipsoidal cavity structure on the semiconductor substrate. The ellipsoidal or semi-ellipsoidal cavity structure encompasses a seed surface of the semiconductor substrate. Fabricating the ellipsoidal or semi-ellipsoidal cavity structure comprises arranging an ellipsoidal or semi-ellipsoidal droplet comprising a sacrificial material (e.g., a group-III semiconductor material) on the semiconductor substrate, forming a layer of a coating material (e.g., a dielectric material) on the semiconductor substrate and the droplet, and selectively removing the sacrificial material of the droplet to expose the ellipsoidal or semi-ellipsoidal cavity structure. Depositing the droplet (e.g., of a solution) can include performing selective metal deposition of the droplet by metal-organic chemical vapor deposition.

The method includes a further step of growing the ellipsoidal or semi-ellipsoidal semiconductor structure within the cavity structure from the seed surface of the semiconductor substrate. In some embodiments, the growing is performed via atmospheric pressure chemical vapor deposition (CVD), metal organic CVD (MOCVD), low or reduced pressure CVD, ultra-high vacuum CVD, molecular beam epitaxy (MBE), atomic layer deposition (ALD), or hydride vapor phase epitaxy. Growing the ellipsoidal or semi-ellipsoidal semiconductor structure can also include steps of growing, in the ellipsoidal or semi-ellipsoidal cavity structure, a first doped semiconductor layer of a first semiconductor material, a quantum well or quantum dot layer of a second semiconductor material on the first doped semiconductor layer, and a second doped semiconductor layer. The following pairs of the first semiconductor material and the second semiconductor material may be selected: InP and InGaAs, AlGaAs and GaAs, GaAs and InGaAs, GaN and InGaN, AlGaN and GaN, or any other ternary or quaternary alloys thereof.

The method can also include steps of providing an insulating layer on the semiconductor substrate and patterning and etching the insulating layer in at least one selected area, thereby forming a hole in the insulating layer. Patterning the insulating layer can include providing a lithographic pattern on the insulating layer. The lithographic pattern can define the position of the hole or a plurality of positions of a plurality of holes in the insulating layer. The hole can expose the seed surface, and define a droplet position for the droplet. The droplet can be arranged at the droplet position by a selective deposition, forming the coating layer by a conformal deposition, forming an opening in the coating layer to provide an access to the sacrificial material, and selectively removing the sacrificial material of the droplet via the opening of the coating layer. Further, the method can include removing the ellipsoidal or semi-ellipsoidal semiconductor structure from the substrate, and transferring the structure to another substrate.

Additional embodiments are directed to a semiconductor device obtainable by a method that includes providing a semiconductor substrate and fabricating an ellipsoidal or semi-ellipsoidal cavity structure on the semiconductor substrate. The ellipsoidal or semi-ellipsoidal cavity structure encompasses a seed surface of the semiconductor substrate. Fabricating the ellipsoidal or semi-ellipsoidal cavity structure comprises arranging an ellipsoidal or semi-ellipsoidal droplet comprising a sacrificial material on the semiconductor substrate, forming a layer of a coating material on the semiconductor substrate and the droplet, and selectively removing the sacrificial material of the droplet to expose the ellipsoidal or semi-ellipsoidal cavity structure. The method includes a further step of growing the ellipsoidal or semi-ellipsoidal semiconductor structure within the cavity structure from the seed surface of the semiconductor substrate.

Further embodiments are directed to a semiconductor device, which includes a semiconductor substrate, an insulating layer on the semiconductor substrate, and a hole in the insulating layer. The hole exposes a seed surface of the semiconductor substrate. The device also includes an ellipsoidal or semi-ellipsoidal cavity structure arranged on the insulating layer around the opening, and an ellipsoidal or semi-ellipsoidal semiconductor structure that has been epitaxially grown from the seed surface of the semiconductor substrate in the ellipsoidal or semi-ellipsoidal cavity structure. The ellipsoidal or semi-ellipsoidal cavity structure can be arranged on top of the semiconductor substrate, which can be a pre-patterned substrate having one or more topological features. The semiconductor device can be a laser configured to generate whispering gallery modes. The semiconductor structure can have a gain structure comprising an active gain material.

DETAILED DESCRIPTION

Figure 1A:
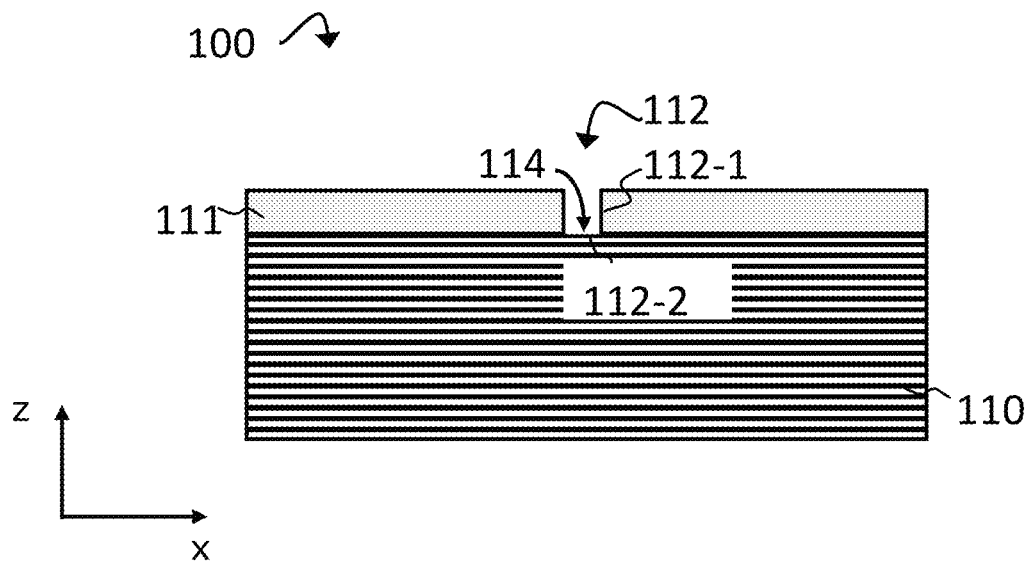
FIG. 1A illustrates a cross sectional view of an initial structure of a fabrication method, according to some embodiments of the present disclosure.

Laser devices may be formed on separate substrates from devices' silicon (Si) substrates with field effect transistors. However, this approach is useful for applications requiring fewer high-performance emitters, and where the footprint or integration density of the photonic components is not the main concern. To overcome these disadvantages, there is interest in integrating nanoscale lasers ("nanolasers") on Si substrates. This can combine the high-speed, frequency multiplexed performance of photonics with the integration densities of electronics. Nanolasers are lasers having nanoscale dimensions (e.g., approximately 1-100 nm), though their optical cavities (also referred to as resonators) can be on the order of up to several microns (e.g., about 1-5μ).

Devices with nanolasers integrated on Si can be used in a number of applications ranging from optical on-chip data communications to sensing and bio-applications. Spherical resonators are typically used in whispering gallery mode resonators. However, the fabrication of ellipsoidal or semi-ellipsoidal optical resonators for nanolasers, in particular spherical or semi-spherical resonators, remains a challenge and is often limited in the choice of the active materials.

Disclosed herein is a method for fabricating an ellipsoidal or semi-ellipsoidal semiconductor structure. An ellipsoidal or semi-ellipsoidal cavity structure is fabricated on the semiconductor substrate. In some embodiments, the ellipsoidal or semi-ellipsoidal semiconductor structures are spheres or semi-spheres. Fabricating this cavity structure includes arranging an ellipsoidal or semi-ellipsoidal droplet comprising a sacrificial material on the semiconductor substrate, forming a coating layer on the semiconductor substrate and the droplet, and selectively removing the sacrificial material of the droplet to expose the cavity structure.

The disclosed method can provide an efficient way to fabricate an ellipsoidal or semi-ellipsoidal cavity structure, in particular a spherical or semi-spherical cavity structure. According to embodiments the droplets may have a shape of an optical resonator. With such a shape, methods according to embodiments of the disclosure may facilitate the fabrication of optical resonators in an efficient way. The droplet can provide a negative mold for the cavity. A droplet may be generally understood as a piece of a material, in particular a small piece of material, that is "dropped", i.e. arranged or deposited on the semiconductor substrate. According to embodiments the droplets may be dropped on the substrate in a solid or in a liquid form. According to embodiments, the droplet may have a spherical, semi-spherical, ellipsoidal or semi-ellipsoidal shape.

It should be noted that the droplet and the semiconductor structure do not necessarily need to have an exact spherical or ellipsoidal shape. Rather embodiments of the disclosure shall also cover droplets and corresponding semiconductor structures that have a substantially ellipsoidal or semi-ellipsoidal shape. Furthermore, embodiments of the disclosure shall also cover droplets and corresponding semiconductor structures that approach the form of an ellipsoidal or semi-ellipsoidal shape in such a way that they may form an optical resonator.

The term "arranged on the semiconductor substrate" shall be understood in a broad sense and shall include in particular embodiments according to which an intermediate layer, e.g. an insulating layer, is arranged between the substrate and the droplet. Hence the term "arranged on the substrate" shall include the meaning "arranged above the substrate".

The disclosed method can also include steps of providing an insulating layer on the semiconductor substrate, and patterning and etching the insulating layer in at least one selected area, thereby forming a hole in the insulating layer. The hole exposes the seed surface, and defines the droplet's position. The method according to this embodiment includes further steps of arranging the droplet at the droplet position by a selective deposition, forming the coating layer by a conformal deposition, forming an opening in the coating layer to provide an access to the sacrificial material, and selectively removing the sacrificial material of the droplet via the opening of the coating layer.

In some embodiments, patterning the insulating layer includes providing a lithographic pattern on the insulating layer. The lithographic pattern defines the position of the hole or a plurality of positions of a plurality of holes in the insulating layer. The hole(s) in turn define the positions of the droplets in a precise manner, and the droplets in turn define the position of the in particular spherical cavities and the in particular spherical semiconductor structures. Further, the holes can provide access to the substrate, and create a seed where a crystal growth of the semiconductor structure, such as the spherical semiconductor structure, may nucleate.

The disclosed ellipsoidal and/or semi-ellipsoidal semiconductor structures may be embodied as optical resonators, and can allow greater precision for control and positioning of the resonator position. This may provide significant advantages for efficient coupling, and for several applications such as plasmonics, solar cells, sensors and devices including arrays of ellipsoidal (e.g., spherical) semiconductor structures.

According to embodiments, the semiconductor substrate may be a Si-substrate. Accordingly, the seed surface may be a Si-seed surface. Hence ellipsoidal or semi-ellipsoidal resonators may be grown on silicon according to embodiments. This sets the path towards integration of the disclosed resonators with silicon complementary metal-oxide-semiconductors (CMOS).

In some embodiments, selectively removing the sacrificial material with respect to the coating and the substrate includes performing a selective etching, e.g. by a piranha etch. The sacrificial material according to such an embodiment may include, e.g., solid silica, a polymer, or metal droplets in a solution. In other embodiments, the sacrificial material may be embodied as a group-III material (e.g., gallium (Ga) or indium (In)) or a metallic material. According to further embodiments, the sacrificial material may be a polymer or any material which may form in particular a spherical shape through surface tension as a molten droplet.

Selectively depositing the droplet can include performing a selective metal deposition of the droplet by metal-organic chemical vapor deposition. The droplet can have a solid state arranged in a solution. According to such an embodiment the size and diameter of the droplet may be predefined by adding the respective droplet or a plurality of droplets to the solvent. The deposition of the droplet may be fostered according to embodiments by a vaporization of the solvent, e.g., by a heating of the solution. The substrate can be pre-patterned so that the semiconductor structure is formed on a patterned structure, in order to enhance features such as optical isolation and quality factor. The pre-patterned substrate may include topological features such as pillars or pyramids.

The semiconductor structure can be a group III-V semiconductor material such as InP, InGaAs, AlGaAs, GaAs, GaN, or AlN. In some embodiments, the coating material may be a dielectric material, such as silicon oxide ($SiO_2$). Forming the coating layer can include performing a conformal deposition of $SiO_2$, which can be carried out by atomic layer deposition.

Growing the ellipsoidal or semi-ellipsoidal semiconductor structure can include steps of growing in the ellipsoidal or semi-ellipsoidal cavity structure a first doped semiconductor layer of a first semiconductor material, growing in the ellipsoidal or semi-ellipsoidal cavity structure a quantum well or quantum dot layer of a second semiconductor material on the first doped semiconductor layer, and growing in the ellipsoidal or semi-ellipsoidal cavity structure a second doped semiconductor layer. According to further embodiments, the growing of the semiconductor structure may be performed by metal organic chemical vapor deposition (MOCVD), atmospheric pressure CVD, low or reduced pressure CVD, ultra-high vacuum CVD, molecular beam epitaxy (MBE), atomic layer deposition (ALD) or hydride vapor phase epitaxy.

The first semiconductor material is different from the second semiconductor material, and has a different bandgap than the second semiconductor material. According to embodiments, the following pairs of the first semiconductor material and the second semiconductor material may be selected: InP and InGaAs, AlGaAs and GaAs, GaAs and InGaAs, GaN and InGaN, AlGaN and GaN, or any other ternary or quaternary alloys thereof.

According to embodiments, the width of the first semiconductor layer, the second semiconductor layer, and the quantum wells or quantum dots in the growth direction may be controlled via one or more growth parameters of the epitaxial growth. A growth parameter may be any parameter that is suitable to control the epitaxial growth. One suitable parameter is the time of the epitaxial growth. With such an embodied method the width of the quantum wells may be precisely controlled and fabricated in a reliable and efficient way.

The fabricated semiconductor structure can be removed from the substrate, and transferred to any other platform that may include but is not restricted to a liquid, a polymer, or another substrate. The disclosed method can be used to fabricate advanced ellipsoidal or semi-ellipsoidal semiconductor structures, such as lasers. In particular, by changing the type and ratio of precursors during the growth, doping profiles as well as heterojunctions and quantum wells may be implemented within the gain structure. In some embodiments, a semiconductor device is produced according to the disclosed method.

The semiconductor device has a semiconductor substrate, an insulating layer on the semiconductor substrate, and a hole in the insulating layer. The hole exposes a seed surface of the semiconductor substrate. Furthermore, an ellipsoidal or semi-ellipsoidal cavity structure is arranged on the insulating layer around the opening, and the device includes an ellipsoidal or semi-ellipsoidal semiconductor structure that has been epitaxially grown from the seed surface of the semiconductor substrate in the ellipsoidal or semi-ellipsoidal cavity structure. According to a further embodiment, the semiconductor device is embodied as an optical resonator or laser, in particular a laser configured to generate whispering gallery modes.

The cavity structure and the semiconductor structure may have in particular a spherical or semi-spherical form or shape and/or a structure, form or shape of an optical resonator. The generation of these whispering gallery modes, which may also be denoted as whispering-gallery waves, can be facilitated by the provision of the spherical semiconductor structures forming a resonant cavity. The semiconductor structure can have a gain structure with an active gain material. The gain structure may include one or more quantum wells. The quantum wells may include a second semiconductor material that is different from the first semiconductor material. Further, the gain structure can have positively, intrinsic or negatively doped semiconductor layers.

For example, the gain structure may include a positively doped semiconductor layer of a first semiconductor material and a negatively doped semiconductor layer of the first semiconductor material. Furthermore, one or more quantum wells may be arranged between the positively doped semiconductor layer and the negatively doped semiconductor layer. The quantum wells may include a second semiconductor material that is different from the first semiconductor material. The positively doped semiconductor layer and the negatively doped semiconductor layer may establish together with the quantum wells a p-i-n ("pin") junction of a diode of a laser. The first semiconductor material and the second semiconductor material may be embodied in particular as one of the following pairs of materials: InP and InGaAs, AlGaAs and GaAs, GaAs and InGaAs, GaN and InGaN, AlGaN and GaN, or any other ternary or quaternary alloys thereof.

The steps of the different aspects of the disclosure may be performed in different orders as appropriate. Furthermore, the steps may also be combined as appropriate, i.e. that e.g. two or more steps may be performed together.

Advantages of the features of one aspect of the disclosure may apply to corresponding features of another aspect of the disclosure.

Devices according to embodiments of the disclosure may be operated as optical resonators at wavelengths ranging from the ultraviolet to the near-infrared spectral window. The size and diameter of the in particular spherical semiconductor structure may be used to tune the emission wavelength of the optical resonator. According to embodiments, the size and diameter of the in particular spherical semiconductor structures may be in the range of tens of nanometers to hundreds of microns.

Embodiments of the disclosure will be described in more detail below, by way of illustrative and non-limiting examples, with reference to the accompanying drawings.

FIGS. 1A-4D generally show enlarged cross-sectional views, top views and 3-dimensional views of initial, intermediate and final structures formed during the stages of the fabrication method. In any or all of the figures the dimensions may not be drawn to scale and may be shown in a simplified and schematic way to illustrate the features and principles of embodiments of the disclosure.

The term "on" and "above" is used in this context, as is customary, to indicate orientation or relative position in a vertical or orthogonal direction to the surface of the substrate, in particular in a vertical z-direction.

FIGS. 1A-1G show successive stages of a method for fabricating a spherical semiconductor structure according to embodiments of the disclosure.

FIG. 1A illustrates a cross sectional view of an initial structure 100 of a fabrication method, according to some embodiments of the present disclosure. The structure 100 includes a substrate 110. The substrate 110, illustrated by a horizontal pattern, includes a semiconductor material and may be, e.g., a bulk semiconductor substrate. The substrate 110 may be embodied as a crystalline semiconductor or a compound semiconductor wafer of a large diameter. The substrate 110 may include, for example, a material from group IV of the periodic table as semiconductor material. Materials of group IV include, for example, silicon, germanium, mixed silicon and germanium, mixed silicon and carbon, mixed silicon germanium and carbon and the like. For example, the substrate 110 may be a crystalline silicon wafer that is used in the semiconductor industry.

The structure 100 further includes an insulating layer 111, illustrated by a grey color, on the substrate 110. The thicknesses of the substrate 110 and the insulating layer 111 can be any suitable thicknesses. The insulating layer 111 may be embodied e.g. as a dielectric layer. The insulating layer 111 can be formed by known methods, as for example thermal oxidation, chemical vapor deposition (CVD), plasma enhanced CVD (PECVD), atomic layer deposition, chemical solution deposition, MOCVD, evaporation, sputtering and other deposition processes. Examples of such dielectric material include, but are not limited to: $SiO_2$, $Si_3N_4$, $Al_2O_3$, AlON, $Ta_2O_5$, $TiO_2$, $La_2O_3$, $SrTiO_3$, $LaAlO_3$, $ZrO_2$, $Y_2O_3$, $Gd_2O_3$, MgO, MgNO, Hf-based materials, and combinations including multilayers thereof.

The insulating layer 111 of the structure 100 includes a hole 112 which has been formed in the insulating layer 111. The hole 112 has sidewalls 112-1 and a bottom 112-2. The bottom 112-2 corresponds to a seed surface 114 of the substrate. The formation of the hole 112 may be performed by patterning and etching the insulating layer 111, e.g., by lithography and subsequent wet or dry etching techniques, e.g., by reactive ion etching or hydrofluoric acid (HF) etching. The hole 112 defines a droplet position for a droplet to be subsequently arranged on the substrate 110.

Figure 1B:
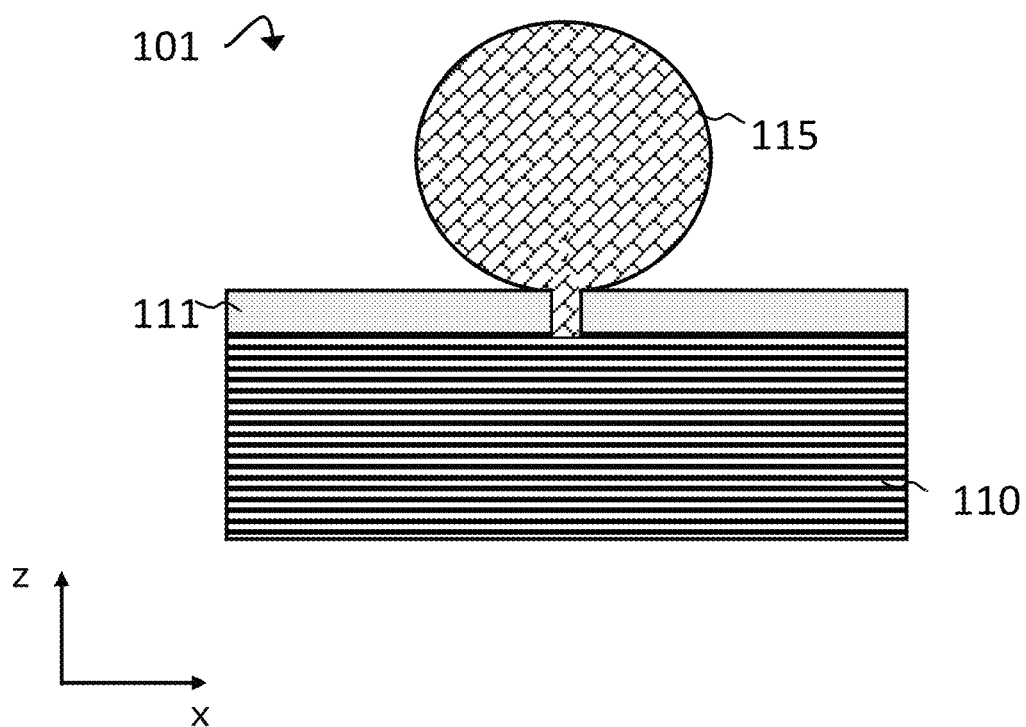
FIG. 1B illustrates a cross sectional view of a structure after a droplet has been arranged on the structure of FIG. 1A, according to some embodiments of the present disclosure.

FIG. 1B illustrates a cross sectional view of a structure 101 after a droplet 115 has been arranged on the structure 100 of FIG. 1A, according to some embodiments of the present disclosure. More particularly, the droplet 115 has been arranged by a selective deposition at the droplet position defined by the hole 112 (FIG. 1A). The droplet 115 includes a sacrificial material, illustrated by a brick pattern. According to embodiments the sacrificial material may be a group III-material. According to further embodiments, the sacrificial material may be a metal. According to embodiments, the sacrificial material may be Ga or In.

The droplet 115 establishes a negative mold for an ellipsoidal cavity structure, in particular a spherical cavity structure to be formed subsequently. The droplet 115 may be generally deposited in any technology that is particularly suitable for the respective sacrificial material. According to embodiments, the selective deposition of the droplet 115 may be in particular performed by a selective deposition of the droplet 115 by metal-organic chemical vapour deposition. Hence according to such an embodiment, the droplet is embodied as a metal-droplet. The step of selectively depositing the metal-droplet 115 may involve a precise control of the droplet diameter, e.g., by controlling the amount of the deposited sacrificial material. This may be used to tune the size and diameter of the spherical semiconductor structure to be formed. And this in return allows to control e.g. the resonator size of the spherical semiconductor structure, and to provide a tunable wavelength/resonance frequency of the spherical semiconductor structure.

In some embodiments, the selective deposition of the droplet 115 may be performed by depositing a solution including the droplet on the substrate 110. The solution may include a liquid or polymeric matrix and nano- or microspheres, here referred to as droplets, such as glass, gold, silica, poly(methyl methacrylate) (PMMA), polystyrene, etc. This method may involve a further step of heating the solution to foster a vaporization of the solvent.

Figure 1C:
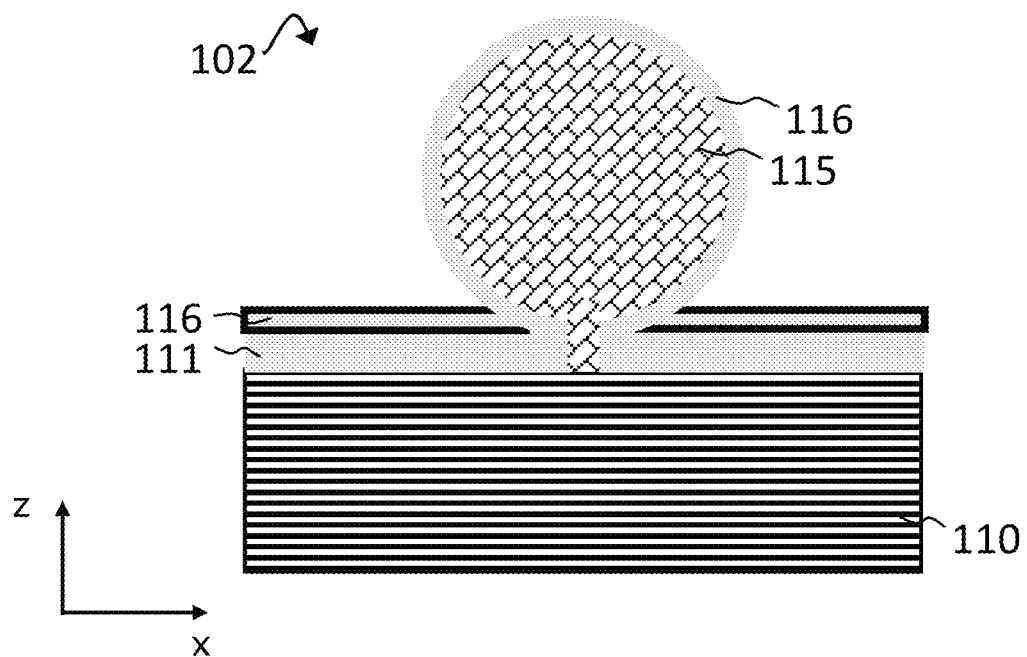
FIG. 1C illustrates a cross sectional view of a structure after a coating layer has been formed on the structure of FIG. 1B, according to some embodiments of the present disclosure.

FIG. 1C illustrates a cross sectional view of a structure 102 after a coating layer 116 of a coating material has been formed on the structure 101 of FIG. 1B, according to some embodiments of the present disclosure. The coating layer 116, illustrated by a grey color, may be in particular performed by a conformal deposition technique. The coating layer 116 may be in particular embodied as an insulating layer, e.g. of an oxide such as silicon oxide or silicon nitride, but might also be a layer of carbon or of other materials which suppress a deposition of the semiconductor during a subsequent selective growth in a cavity structure. According to embodiments, the coating layer 116 may include the same material as the insulating layer 111 or a different material than the insulating layer 111.

According to embodiments, the material of the coating layer 116 is selected to have a low sticking coefficient, and hence low nucleation probability, for the semiconductor material to be grown in the cavity structure.

According to embodiments, the conformal deposition may be performed by atomic layer deposition, e.g. by atomic layer deposition of $SiO_2$.

Figure 1D:
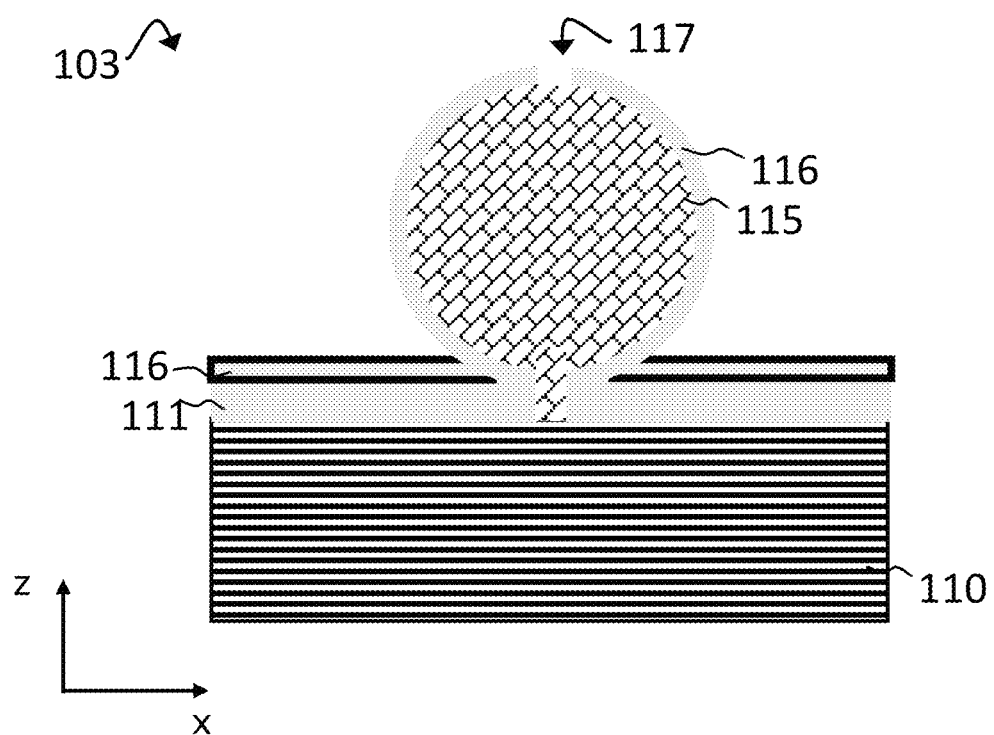
FIG. 1D illustrates a cross sectional view of a structure after an opening has been formed in the coating layer, according to some embodiments of the present disclosure.

FIG. 1D illustrates a cross sectional view of a structure 103 after an opening 117 has been formed in the coating layer 116 to provide an access to the sacrificial material of the droplet 115, according to some embodiments of the present disclosure. The opening 117 may be in particular formed at the top of the coating layer 116. The opening 117 provides access to the sacrificial material of the droplet 115. The opening 117 may be performed e.g. by reactive ion etching.

Figure 1E:
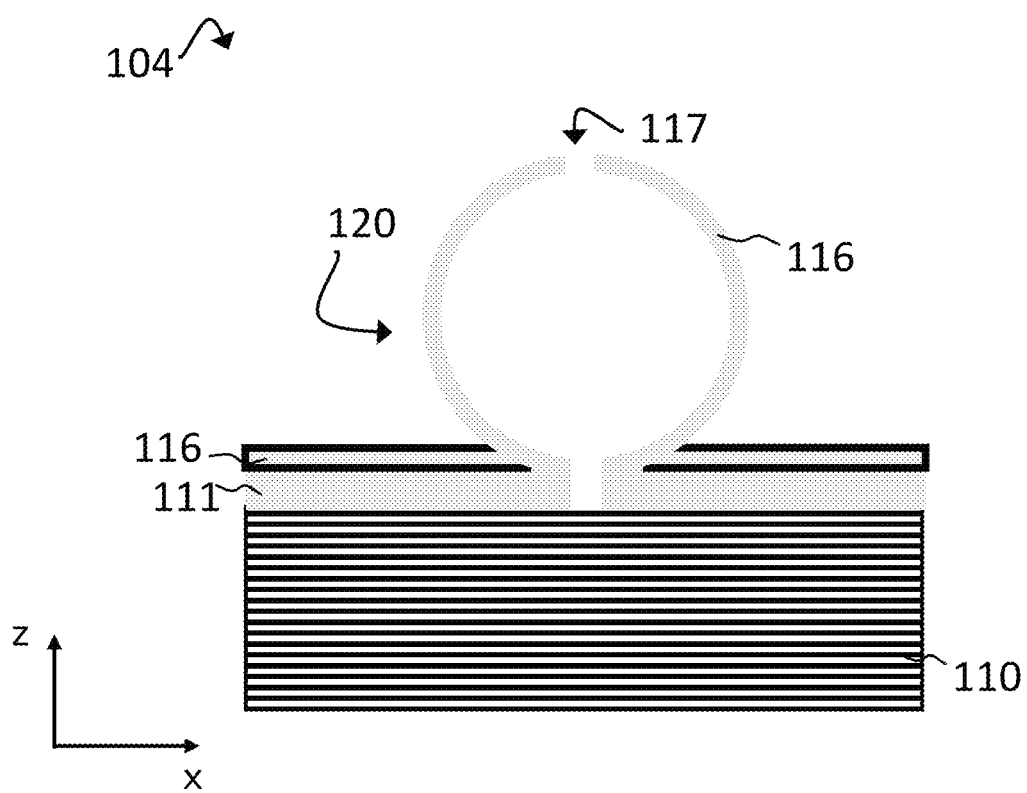
FIG. 1E illustrates a cross sectional view of a structure after the sacrificial material of the droplet has been removed, according to some embodiments of the present disclosure.

FIG. 1E illustrates a cross sectional view of a structure 104 after the sacrificial material of the droplet 115 (FIGS. 1B-1D) has been removed via the opening 117 of the coating layer 116, according to some embodiments of the present disclosure. The selective removal may be performed by selective etching techniques. The suitable etching technique may depend on the material used as sacrificial material. In general, the etching technique is chosen to be such that it only etches the sacrificial material, but not the material of the coating layer 116. The selective removal may be performed in particular by a wet etching of the sacrificial material of the droplet 115. The wet etching may be performed e.g. by a piranha etch. Such a piranha etch uses a piranha solution, which is a mixture of sulfuric acid ($H_2SO_4$) and hydrogen peroxide ($H_2O_2$).

As a result of the steps described above, a spherical cavity structure 120 has been formed on the semiconductor substrate 110. The spherical cavity structure 120 encompasses the coating layer 116, the hole 112 (FIG. 1A) in the insulating layer 111 as well as the seed surface 114 of the substrate 110 at the bottom of the hole 112 (FIG. 1A).

Figure 1F:
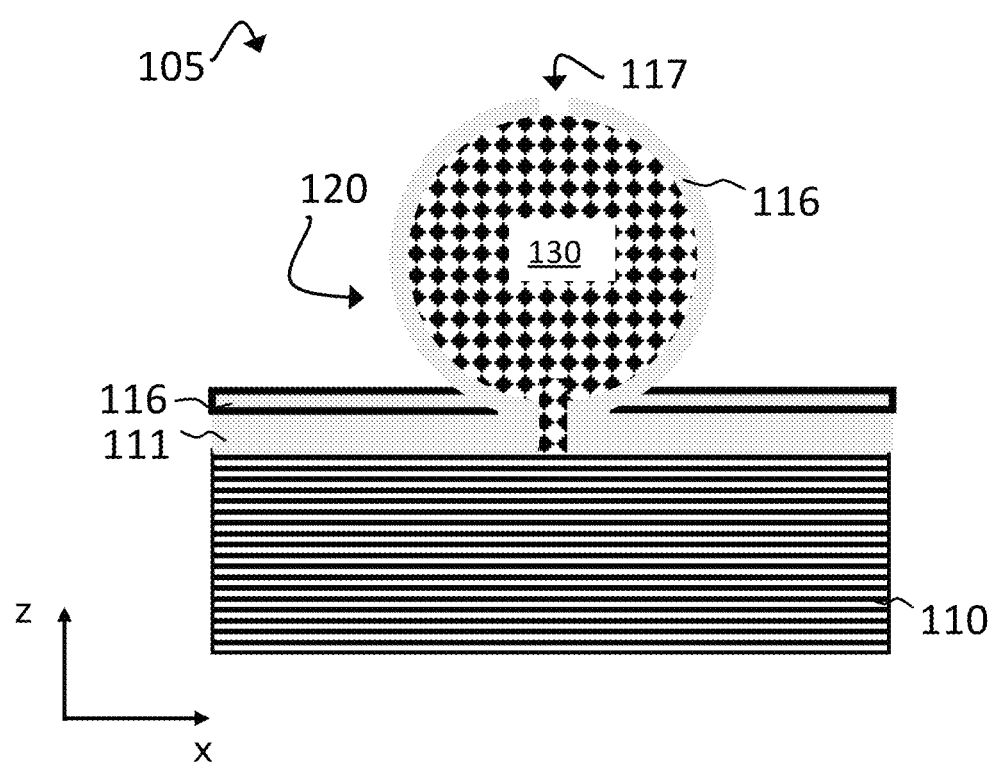
FIG. 1F illustrates a cross sectional view of a structure after a spherical semiconductor structure has been grown in the spherical cavity structure, according to some embodiments of the present disclosure.

FIG. 1F illustrates a cross sectional view of a structure 105 after a spherical semiconductor structure 130 has been grown in the spherical cavity structure 120 from the seed surface 114 (FIG. 1A) of the semiconductor substrate 110, according to some embodiments of the present disclosure. The semiconductor structure 130, illustrated by a diamond pattern, may include in particular a group III-V semiconductor material, such as InP, InGaAs, AlGaAs, or GaAs, GaN or AlN. In some embodiments, the growing of the spherical semiconductor structure 130 can be performed by MOCVD, atmospheric pressure CVD, low or reduced pressure CVD, ultra-high vacuum CVD, molecular beam epitaxy (MBE), atomic layer deposition (ALD), or hydride vapor phase epitaxy.

Figure 1G:
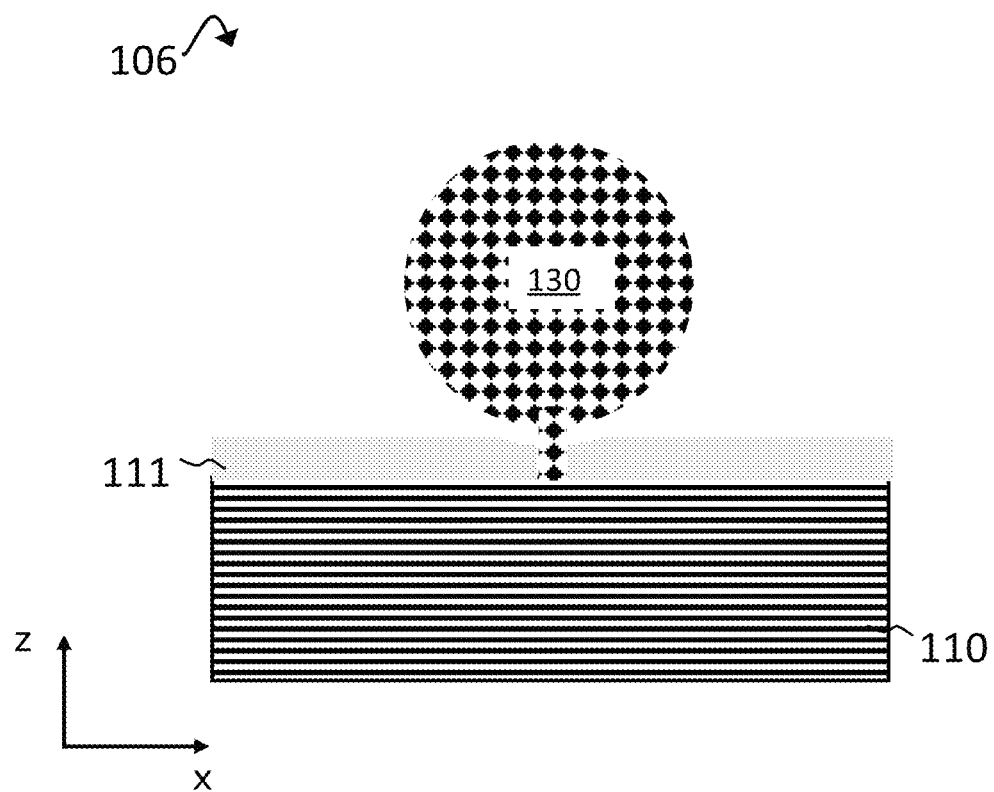
FIG. 1G illustrates a cross sectional view of a spherical semiconductor structure after the coating layer has been selectively removed, according to some embodiments of the present disclosure.

FIG. 1G illustrates a cross sectional view of a structure 106 after the coating layer 116 (FIGS. 1C-1F) of the coating material has been removed selectively, according to some embodiments of the present disclosure. The insulating layer 111 may or not may be removed.

In general, the versatility of methods according to embodiments of the disclosure may allow any combination of group III-V semiconductor materials in the spherical cavity structure 120, including embedded quantum wells, quantum dots or quantum wires and doped or intrinsic semiconductor layers.

Figure 2:
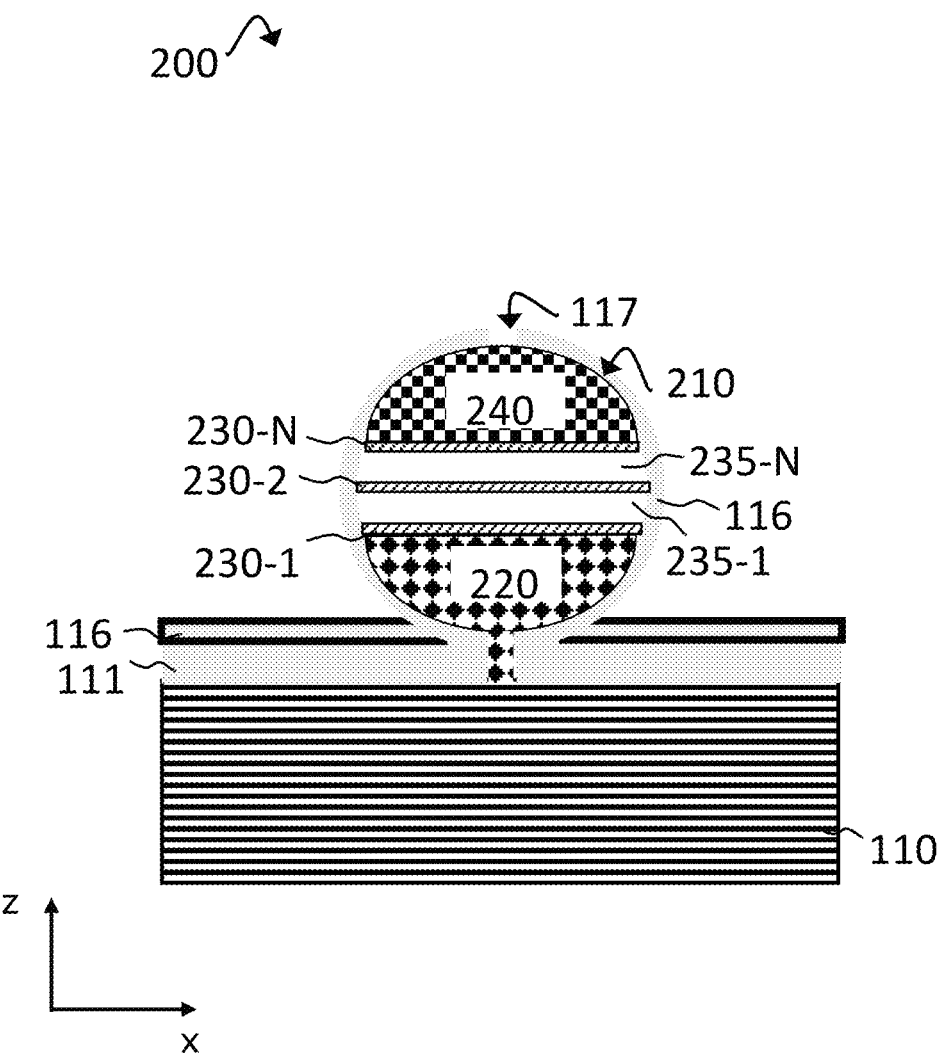
FIG. 2 shows a cross sectional view of a structure having a spherical semiconductor structure that includes a combination of different materials that have been grown in the spherical cavity structure, according to some embodiments of the present disclosure.

FIG. 2 illustrates a cross sectional view of a structure 200 having a spherical semiconductor structure 210 that includes a combination of different materials that have been grown in the spherical cavity structure 120 (FIG. 1E), according to some embodiments of the present disclosure. The semiconductor structure 210 is illustrated as a more complex gain structure than the semiconductor structure 130 illustrated in FIG. 1F.

In a first sub-step for growing the semiconductor structure 210, a first doped (or intrinsic) semiconductor layer 220 of a first semiconductor material has been grown in the spherical cavity 120, illustrated by a diamond pattern. In a second sub-step, one or more quantum well or quantum dot layers 230-1, 230-2, 230-N (collectively, 230) of a second semiconductor material have been grown on the first doped semiconductor layer 220. Additional layers 235-1, 235-N (collectively, 235) of a semiconductor material can be grown on the quantum well or dot layers 230. This is discussed in greater detail below. In a third sub-step, a second doped semiconductor layer 240 of the first semiconductor material has been grown in the spherical cavity 120, illustrated by a checkerboard pattern. The first semiconductor layer 220, the second semiconductor layer 240 and the quantum well or quantum dot including layers 230 collectively form the gain structure. The first semiconductor layer 220 and the second semiconductor layer 240 form cladding layers for the quantum wells 230.

The growing of the plurality of quantum wells 230 can be performed by growing sequentially in the cavity structure 120, in an alternating way, a plurality of semiconductor layers of different semiconductor materials. The different semiconductor materials have different bandgaps to facilitate the formation of the quantum wells 130.

As an example, the first semiconductor material can be embodied as InP, and the quantum wells 230 can be embodied as InGaAs. The plurality of quantum wells 230 can then be formed as follows. At first, a quantum well 230-1 of the second semiconductor material is grown on the first semiconductor layer 220. Then, a layer 235-1 of the first semiconductor material is grown on the quantum well 230-1. The layer 235-1 may be in particular an intrinsic semiconductor material, e.g. intrinsic InP. Then another quantum well 230-2 and another layer 235-2 of an intrinsic semiconductor material may be grown. In some embodiments, this is repeated as desired to form layers 230-N and 235-N. Finally, the second doped semiconductor layer 240 of opposite polarity to the first doped semiconductor layer 220 is formed on the last grown quantum well 230-2 or 230-N.

The first semiconductor material of the cladding layers, e.g., of the semiconductor layer 220, the first semiconductor layer 240 and the additional semiconductor layers 235, have a different bandgap than the second semiconductor material of the quantum wells 230.

According to embodiments, the first semiconductor material may be a first group III-V semiconductor material and the second semiconductor material a second group III-V semiconductor material with a different bandgap to provide quantum confinement. In particular, the first group III-V semiconductor material of the cladding layers 220 and 235 has a larger bandgap than the second semiconductor material of the quantum layer 230. One preferred combination of the first and the second group III-V semiconductor materials include InP as semiconductor material of the cladding layers 220 and 235 and InAlGaAs as semiconductor material of the quantum wells 235. Other combinations can include AlGaAs combined with GaAs and GaAs combined with InGaAs. The group III-V materials may be generally binary as well as ternary or quaternary materials.

According to other embodiments, appropriate pairs of group II-VI semiconductor compounds, mixed group II-VI semiconductor compounds, and group IV-VI semiconductor compounds may be used. According to further embodiments, combinations may encompass group-III-nitride materials, e.g., AlGaN combined with GaN or GaN combined with InGaN. According to other embodiments, the first semiconductor layer 220 can be a n-type doped layer, and the second semiconductor layer 240 a p-type doped layer.

Hence the embodied gain structure 210 includes a doping profile which forms a pin structure. This can facilitate electrical pumping. A pin structure is a structure having an intrinsic region arranged between a p-doped region and a n-doped region.

In this respect, doping shall be understood as the intentional introduction of impurities into an intrinsic semiconductor for the purpose of modulating its electrical, optical, and structural properties. Doping a semiconductor introduces allowed energy states within the band gap, but very close to the energy band that corresponds to the dopant type. Positive or p-type doping introduces free holes in the valence band, whereas negative or n-type doping introduces free electrons within the conduction band.

The introduction of dopants has the effect of shifting the energy bands relative to the Fermi level. In an n-type semiconductor the Fermi level is close to the conductance band, or within the conductance band in a degenerate n-type semiconductor. For p-type the Fermi level is close to or within the valance band. Doping densities in typically doped semiconductors range from approximately $5 \times 10^{18}$ cm$^{-3}$ to $10^{20}$ cm$^{-3}$, depending on the material and density of states. Whereas semiconductors are rarely perfectly intrinsic, intrinsic in the electrical sense means that they are not conductive. Typically, the doping level is about $10^{15}$-$10^{16}$ cm$^{-3}$.

Figure 3A:
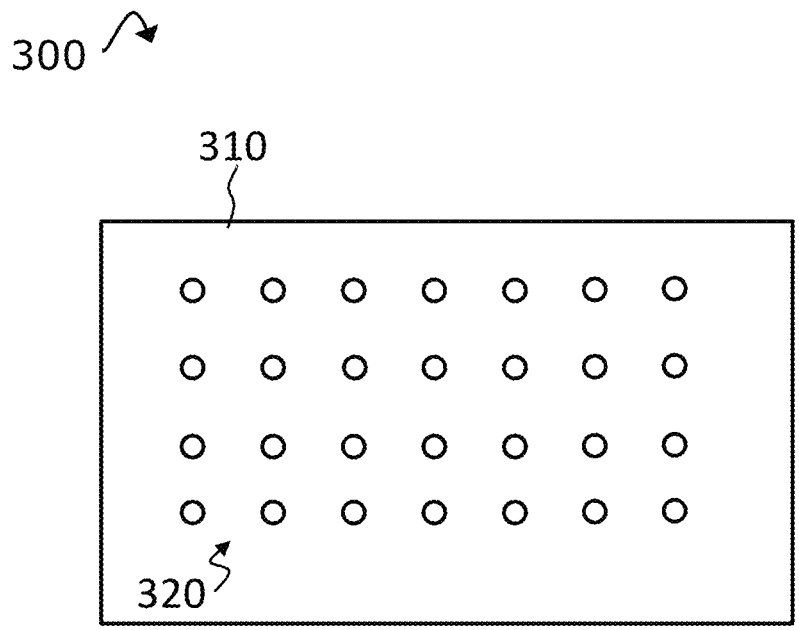
FIG. 3A shows a top view of an insulating layer on a substrate, according to some embodiments of the present disclosure.

FIG. 3A shows a top view 300 of an insulating layer 310, such as the insulating layer 110 illustrated in FIGS. 1-2, on a substrate (not shown), e.g., substrate 110 illustrated in FIGS. 1-2, according to some embodiments of the present disclosure. An array of holes 320 (e.g., hole 112 of substrate 110) has been patterned and etched into the insulating layer 310 (e.g., insulating layer 111 of substrate 110) on the substrate. The pattern of the array of holes 320 can be controlled precisely by lithography. This can allow positioning of a plurality of spherical semiconductor structures (e.g., structures 130 and/or 210, respectively illustrated in FIGS. 1F and 2) in a precise way. For example, a network of spherical semiconductor structures can be formed, which may offer advanced device properties and functionalities. Such devices can be used in neuromorphic applications as well as hardware security.

Figure 3B:
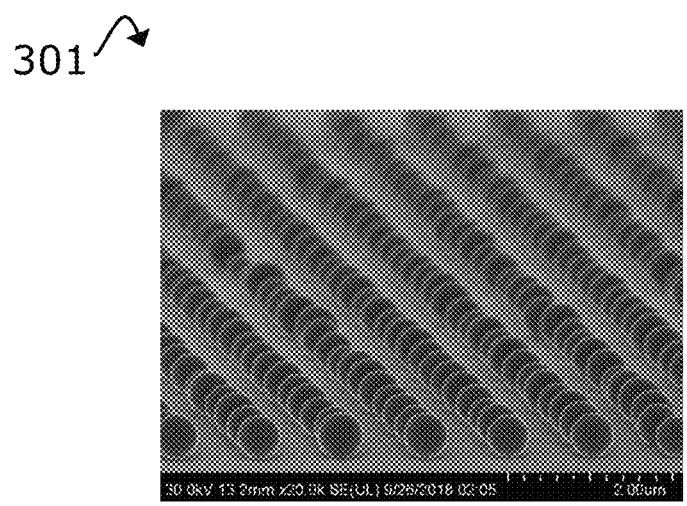
FIG. 3B is a scanning electron microscope image showing a tilted view of an array of droplets, according to some embodiments of the present disclosure.

FIG. 3B is scanning electron microscope image showing a tilted view 301 of an array of droplets, such as the droplet 115 illustrated in FIGS. 1B-1D, according to some embodiments of the present disclosure. The droplets have been arranged by a selective deposition at the droplet position defined by the holes 320 (FIG. 3A). Selective deposition of droplets is discussed in greater detail with respect to FIG. 1B.

Figure 4A:
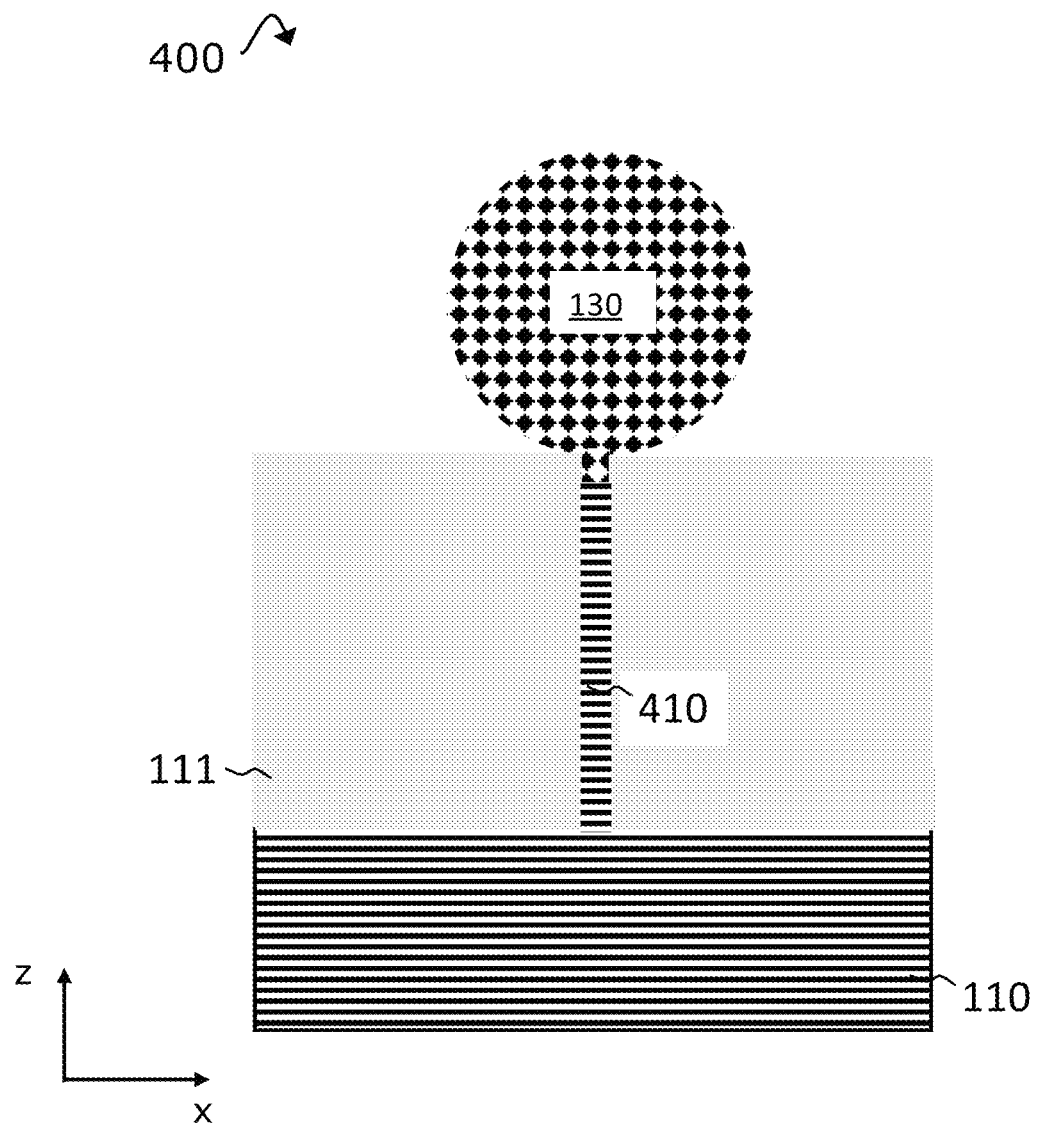
FIG. 4A illustrates a cross sectional view of a structure having a spherical semiconductor structure arranged on top of a pillar, according to some embodiments of the present disclosure.

FIG. 4A illustrates a cross sectional view of a structure 400 having a spherical semiconductor structure 130 (FIG. 1G) arranged on top of a pillar 410, according to some embodiments of the present disclosure. The pillar 410 extends through the insulating layer 111 (FIGS. 1-2) of the substrate 110 (FIGS. 1-2). The pillar 410 provides optical isolation of the structure 130 from the substrate 110. The pillar 410 is illustrated as being part of the substrate 110. However, the pillar 410 can be made of the semiconductor material of the semiconductor structure 130 in other embodiments.

Figure 4B:
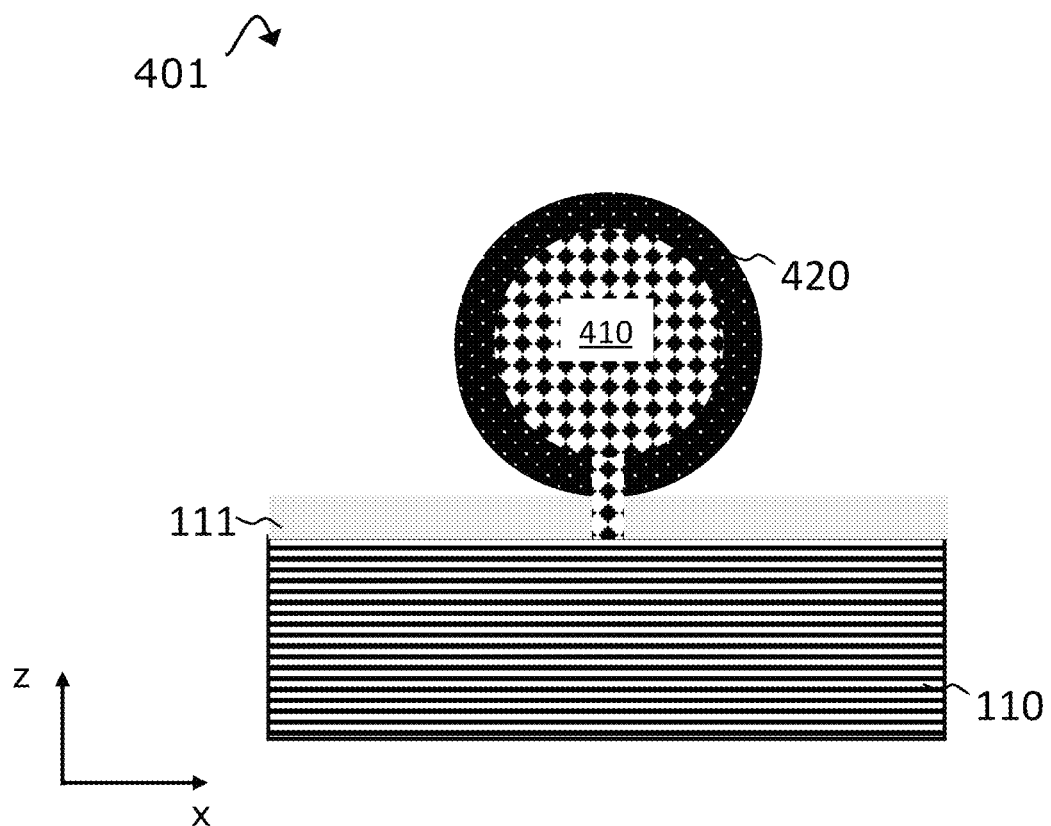
FIG. 4B illustrates a cross sectional view of a core-shell structure, according to some embodiments of the present disclosure.

FIG. 4B illustrates a cross sectional view of a core-shell structure 401 on an insulating layer 110 and substrate 110 (FIGS. 1A-2), according to some embodiments of the present disclosure. The core 410 of the structure 401, illustrated by a diamond pattern, is a spherical semiconductor structure (e.g., structure 130 of FIGS. 1G and 4A), which can be a doped or intrinsic semiconductor material. The shell 420 of the structure 401, illustrated by a black dotted black pattern, is at least one additional material appropriate for nano- or micro-sphere shells (e.g., silica, gold, PMMA, polystyrene, etc.).

Figure 4C:
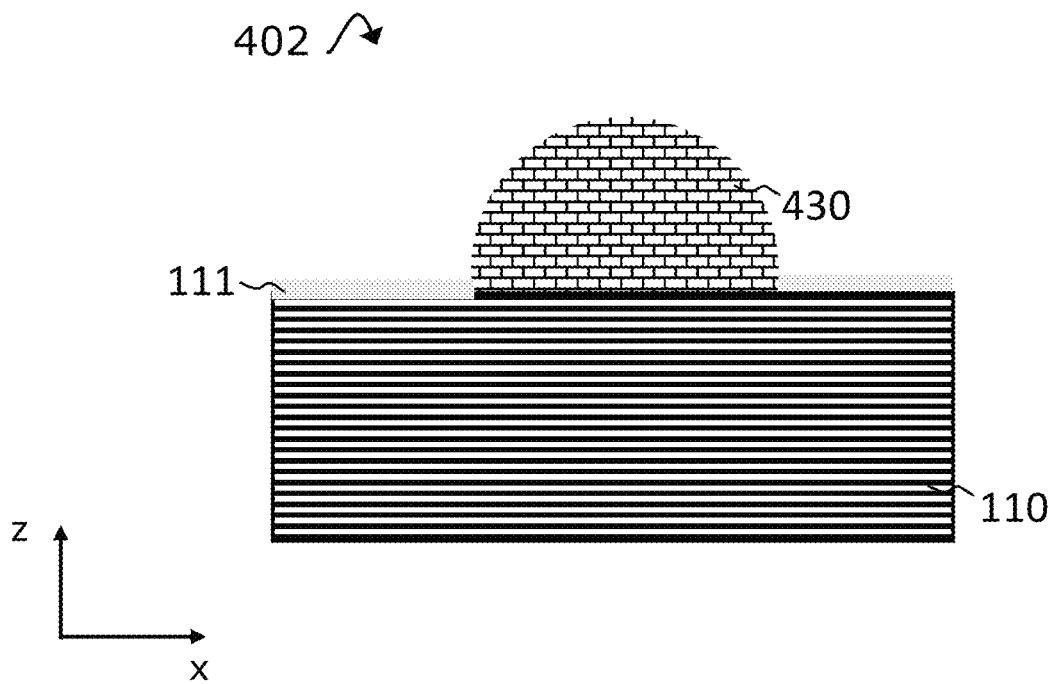
FIG. 4C illustrates a cross sectional view of a structure that includes a droplet shaped as semi-ellipsoid or semi-sphere, according to some embodiments of the present disclosure.

FIG. 4C illustrates a cross sectional view of a structure 402 that includes a droplet 430, illustrated by a brick pattern, shaped as semi-ellipsoid or semi-sphere, according to some embodiments of the present disclosure. The droplet 430 is deposited on a substrate 110 having an insulating layer 111. The substrate 110 and insulating layer 111 are discussed in greater detail with respect to FIG. 1A. The droplet 430 can be a droplet such as the droplet 115 illustrated in FIG. 1B (e.g., a Ga or In droplet). Deposition of droplets such as these is discussed in greater detail with respect to FIG. 1B.

Figure 4D:
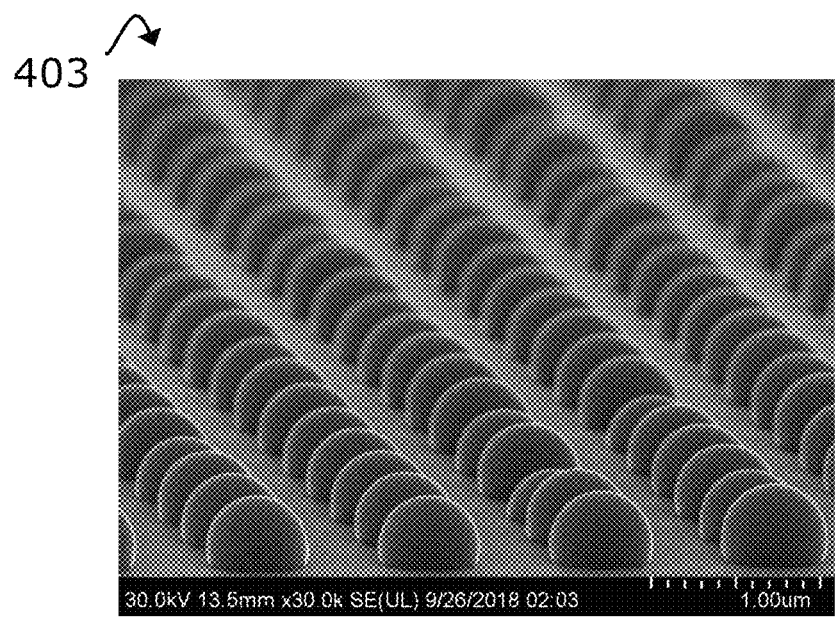
FIG. 4D is a scanning electron microscope image of an array of droplets shaped as semi-ellipsoids or semi-spheres, according to some embodiments of the present disclosure.

FIG. 4D is a scanning electron microscope image 403 of an array of droplets shaped as semi-ellipsoids or semi-spheres, according to some embodiments of the present disclosure. The droplets are droplets such as the droplet 430 illustrated in FIG. 4C.

While illustrative examples are given above, it will be appreciated that the basic fabrication steps described above can be used to produce semiconductor structures of other materials, shapes and sizes. Materials and processing techniques can be selected as appropriate for a given embodiment, and suitable choices will be readily apparent to those skilled in the art.

While particular examples have been described above, numerous other embodiments can be envisaged. The seed surfaces for growing the semiconductor structures may be preferably crystalline seed surfaces but can, according to other embodiments, also be provided by amorphous surfaces. If the seed has a well-defined crystalline orientation, and if the crystal structure of the seed is a reasonable match to that of the growing crystal (for example a group III-V compound semiconductor), the growing crystal can adapt this orientation. If the seed is amorphous or has an undefined crystal orientation, the growing crystal will be single crystalline but its crystal orientation will be random.

The disclosed semiconductor structures and circuits can be part of a semiconductor chip. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has surface interconnections and/or buried interconnections). In any case the chip may be integrated with other chips, discrete circuit elements, and/or other signal processing devices as part of either an intermediate product, such as a motherboard, or an end product. The end product can be any product that includes integrated circuit chips.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e., occurrences) of the element or component. Therefore, "a" or "an" should be read to include one or at least one, and the singular word form of the element or component also includes the plural unless the number is obviously meant to be singular.

As used herein, the term "droplet" may refer to droplets in liquid as well as solid state. As mentioned above, a droplet may be formed according to embodiments by a sacrificial material which may be shaped in a way that may result in an optical resonator. A droplet may be generally understood as a piece of a material, in particular a small piece of material, that can be "dropped", i.e. arranged or deposited on the semiconductor substrate. According to embodiments, a droplet may be formed as sphere or ellipsoid or parts thereof, e.g. as semi-sphere or semi-ellipsoid. According to embodiments the droplets may have the form or shape of an optical resonator.

As used herein, the term "quantum well" is a non-limiting term and not intended to refer to only quantum well embodiments, but may encompass all possible quantum emitting systems like quantum dots and quantum wires.

Ranges (e.g., time, concentration, temperature, etc.) indicated herein include both endpoints and all numbers between the endpoints. Unless specified otherwise, the use of modifying terms such as "about", "approximately", or a tilde (~) in connection to a range applies to both ends of the range (e.g., "approximately 1 g-5 g" should be interpreted as "approximately 1 g-approximately 5 g"). As used herein, these modifying terms indicate +/−10% of a recited value, range of values, or endpoints of one or more ranges of values.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for fabricating an ellipsoidal or semi-ellipsoidal semiconductor structure, the method comprising:
   providing a semiconductor substrate;
   fabricating an ellipsoidal or semi-ellipsoidal cavity structure on the semiconductor substrate, the ellipsoidal or semi-ellipsoidal cavity structure encompassing a seed surface of the semiconductor substrate, wherein the fabricating the ellipsoidal or semi-ellipsoidal cavity structure comprises:
      depositing a droplet comprising a sacrificial material on the semiconductor substrate, wherein the droplet is an ellipsoidal or semi-ellipsoidal droplet;
      forming a coating layer comprising a coating material on the semiconductor substrate and the droplet; and
      selectively removing the sacrificial material of the droplet, thereby exposing the ellipsoidal or semi-ellipsoidal cavity structure; and
   growing the ellipsoidal or semi-ellipsoidal semiconductor structure within the ellipsoidal or semi-ellipsoidal cavity structure from the seed surface of the semiconductor substrate.

2. The method of claim 1, further comprising
   providing an insulating layer on the semiconductor substrate;
   patterning and etching the insulating layer in at least one selected area, thereby forming a hole in the insulating layer, the hole exposing the seed surface and the hole defining a droplet position for the droplet;
   arranging the droplet at the droplet position by a selective deposition;
   forming the coating layer by performing a conformal deposition;
   forming an opening in the coating layer to provide an access to the sacrificial material; and
   selectively removing the sacrificial material of the droplet via the opening of the coating layer.

3. The method of claim 2, wherein the patterning the insulating layer comprises providing a lithographic pattern on the insulating layer, the lithographic pattern defining the position of the hole or a plurality of positions of a plurality of holes in the insulating layer.

4. The method of claim 2, wherein the performing the conformal deposition comprises performing an atomic layer deposition.

5. The method of claim 1, wherein the ellipsoidal or semi-ellipsoidal semiconductor structure is embodied as a spherical or semi-spherical semiconductor structure, and the droplet is embodied as a spherical or semi-spherical droplet.

6. The method of claim 1, wherein the depositing the droplet comprises performing a selective metal deposition of the droplet by metal-organic chemical vapor deposition.

7. The method of claim 1, wherein the depositing the droplet comprises depositing a solution comprising the droplet.

8. The method of claim 1, wherein the sacrificial material is a group-III semiconductor material.

9. The method of claim 1, wherein the coating material is a dielectric material.

10. The method of claim 1, wherein the growing the ellipsoidal or semi-ellipsoidal semiconductor structure comprises:
    growing, in the ellipsoidal or semi-ellipsoidal cavity structure, a first doped semiconductor layer of a first semiconductor material;
    growing, in the ellipsoidal or semi-ellipsoidal cavity structure, a quantum well or quantum dot layer of a second semiconductor material on the first doped semiconductor layer; and
    growing, in the ellipsoidal or semi-ellipsoidal cavity structure, a second doped semiconductor layer of the first semiconductor material.

11. The method of claim 10, wherein the first semiconductor material and the second semiconductor material are selected from the pairs consisting of: InP and InGaAs, AlGaAs and GaAs, and GaAs and InGaAs.

12. The method of claim 1, wherein the ellipsoidal or semi-ellipsoidal semiconductor structure comprises a semiconductor material.

13. The method of claim 12, wherein the semiconductor material is selected from the group consisting of: InP, InGaAs, AlGaAs, GaAs, GaN, InGaN, AlGaN, any ternary or quaternary alloys thereof, group II-VI semiconductors, and group IV semiconductors.

14. The method of claim 1, wherein the growing of the ellipsoidal or semi-ellipsoidal semiconductor structure is performed by one of a group consisting of atmospheric pressure chemical vapor deposition (CVD), metal organic CVD (MOCVD), low or reduced pressure CVD, ultra-high vacuum CVD, molecular beam epitaxy (MBE), atomic layer deposition (ALD), and hydride vapor phase epitaxy.

15. The method of claim 1, further comprising:
    removing the ellipsoidal or semi-ellipsoidal semiconductor structure from the substrate; and
    transferring the ellipsoidal or semi-ellipsoidal semiconductor structure to another substrate.

16. A semiconductor device obtainable by a method comprising:
    providing a semiconductor substrate;
    fabricating an ellipsoidal or semi-ellipsoidal cavity structure on the semiconductor substrate, the ellipsoidal or semi-ellipsoidal cavity structure encompassing a seed surface of the semiconductor substrate;
    growing the ellipsoidal or semi-ellipsoidal semiconductor structure within the ellipsoidal or semi-ellipsoidal cavity structure from the seed surface of the semiconductor substrate, wherein fabricating the ellipsoidal or semi-ellipsoidal cavity structure comprises:

depositing a droplet comprising a sacrificial material on the semiconductor substrate, wherein the droplet is an ellipsoidal or semi-ellipsoidal droplet;

forming a coating layer comprising a coating material on the semiconductor substrate and the droplet; and selectively removing the sacrificial material of the droplet, thereby exposing the ellipsoidal or semi-ellipsoidal cavity structure.

17. A semiconductor device, comprising:

a semiconductor substrate;

an insulating layer on the semiconductor substrate;

a hole in the insulating layer, the hole exposing a seed surface of the semiconductor substrate;

an ellipsoidal or semi-ellipsoidal cavity structure arranged on the insulating layer around the opening; and an ellipsoidal or semi-ellipsoidal semiconductor structure that has been epitaxially grown from the seed surface of the semiconductor substrate in the ellipsoidal or semi-ellipsoidal cavity structure.

18. The semiconductor device of claim 17, wherein the ellipsoidal or semi-ellipsoidal semiconductor structure comprises a gain structure comprising an active gain material.

19. The semiconductor device of claim 17, wherein the semiconductor device is embodied as a laser configured to generate whispering gallery modes.

20. A semiconductor device according to claim 17, wherein the semiconductor substrate is a pre-patterned substrate comprising one or more topological features, and wherein the ellipsoidal or semi-ellipsoidal semiconductor structure is arranged on top of the pre-patterned substrate.

* * * * *